(12) United States Patent
Puri et al.

(10) Patent No.: US 7,732,709 B2
(45) Date of Patent: Jun. 8, 2010

(54) HOUSING FOR ACCOMMODATING ELECTRICAL COMPONENTS

(75) Inventors: Werner Puri, Nürnberg (DE); Joachim Seidl, Sulzbach-Rosenberg (DE)

(73) Assignee: Siemens Aktiengesellschaft, Munich (DE)

( * ) Notice: Subject to any disclaimer, the term of this patent is extended or adjusted under 35 U.S.C. 154(b) by 317 days.

(21) Appl. No.: 11/826,419

(22) Filed: Jul. 16, 2007

(65) Prior Publication Data

US 2008/0017414 A1    Jan. 24, 2008

(30) Foreign Application Priority Data

Jul. 17, 2006  (EP) .................................. 06014844

(51) Int. Cl.
    *H02G 3/08* (2006.01)
(52) U.S. Cl. .............................. 174/50; 174/58; 174/60; 174/59; 174/135; 174/66; 174/67; 439/535; 248/56; 220/4.02; 361/651
(58) Field of Classification Search .................. 174/50, 174/58, 60, 135, 59, 66, 67; 220/241, 242, 220/4.02; 439/535, 604; 248/56; 361/651
    See application file for complete search history.

(56) References Cited

U.S. PATENT DOCUMENTS

| | | | |
|---|---|---|---|
| 3,994,555 A | 11/1976 | Konno et al. | |
| 4,049,357 A * | 9/1977 | Hamisch, Jr. | ................ 403/209 |
| 4,698,459 A | 10/1987 | Drake | |
| 4,778,408 A | 10/1988 | Morrison | |
| 5,656,797 A * | 8/1997 | Lin | .............................. 174/91 |
| 5,800,028 A * | 9/1998 | Smith et al. | .............. 312/223.1 |
| 6,992,252 B1 * | 1/2006 | Rao et al. | .................... 174/651 |

FOREIGN PATENT DOCUMENTS

| | | |
|---|---|---|
| DE | 36 29 783 C2 | 3/1988 |
| DE | 202 16 515 U1 | 4/2004 |

\* cited by examiner

*Primary Examiner*—Dhiru R Patel
(74) *Attorney, Agent, or Firm*—Harness, Dickey & Pierce, P.L.C.

(57) ABSTRACT

A housing is disclosed for accommodating electrical components having a housing lower part, having a conductor feed opening and having a housing cover for covering the housing lower part. In at least one embodiment, the housing is intended to provide the possibility of very convenient fitting and dismantling. The conductor feed opening is provided for the purpose of being delimited by the housing lower part and the housing cover in the closed state of the housing. This obviates the need for the careful threading-in operation when installing a cable on an electrical component in the interior of the housing. In addition, the housing cover delimiting the conductor feed opening is provided with first guide elements, which are provided for engaging in the housing lower part.

16 Claims, 3 Drawing Sheets

HOUSING FOR ACCOMMODATING ELECTRICAL COMPONENTS

PRIORITY STATEMENT

The present application hereby claims priority under 35 U.S.C. §119 on European patent application number EP 06014844 filed Jul. 17, 2006, the entire contents of which is hereby incorporated herein by reference.

FIELD

Embodiments of the invention generally relate to a housing for accommodating electrical components. For example, they may relate to one having a housing lower part, having a conductor feed opening and having a housing cover for covering the housing lower part. Embodiments of the invention also generally relate to a housing cover and a housing lower part for such a housing.

BACKGROUND

A housing is always used when electrical components need to be shielded or protected from the outside world. The use of such a housing is conceivable, for example, in installation technology, safety technology, automation technology, wiring technology and measurement technology.

Depending on the application, the housing has options for sealing which are determined by the susceptibility of the electrical components. Depending on the protection class, the housing may be provided for protection against the ingress of moisture or spray water or against mechanical stress.

A further function of the housing resides in the fact that the conductors, such as cables, for example, can be fed to the electrical components in the required number. The conductor feed opening increases the complexity of the sealing problem. On the other hand, an easily accessible housing or housing part is advantageous for fitting purposes. As a result, the design of such a housing is a product of a compromise between ease of fitting and problems associated with sealing.

Such a housing is also used in connection with position switches and safety switches. Position switches likewise need to be connected to electrical conductors. This takes place, for example, directly or indirectly via ASI plug-type connectors (actuator/sensor interface plug-type connectors), which are connected to the electrical components, such as a switching element, for example. The position switch housing generally has one or more connection openings and a cover.

When connecting the conductors, the cover is removed in order to connect them to the switch element once they have been threaded in through the conductor openings. The conductor feed openings are also referred to as connection openings and are generally implemented as a standardized interface between the housing the and the surrounding environment of the installation. The standardized interface can in this case be in the form of a conductor screw connection, plug or the like.

Not only the housing or its component parts, but also the connection opening need to meet a plurality of preconditions. They need to protect the device interior against the ingress of foreign bodies and liquids and against other environmental influences. The sealtightness of the housing furthermore needs to correspond to national and international standards. In addition, the possibility of easy fitting of the connection lines is generally desirable.

DE 36 29 783 C2 has disclosed a closure for a housing having a cover part which can be fixed to a base part by way of a snap-action connection. The housing disclosed in the mentioned patent specification can be closed such that it is hermetically sealed at its upper opening side via the cover part. In addition, the housing has a separate conductor feed opening.

SUMMARY

In at least one embodiment, the invention is to develop a housing to such an extent that it meets high safety requirements with regard to closing and sealing functions and, nevertheless, is easy to fit and dismantle.

In at least one embodiment, a conductor feed opening is delimited by the housing lower part and the housing cover in the closed state of the housing, at least one first guide element being integrally formed on the housing cover and being provided for engaging with at least one second guide element, which is arranged in the housing lower part, and for assisting a partial rotational movement of the housing cover.

In at least one embodiment, the invention is based on the knowledge that threading in the connection lines or the conductors results in a reduction in the amount of space available for fitting and therefore in handling problems. When connecting a plurality of lines, under certain circumstances this may lead to problems associated with installation space and bring about a disadvantageous risk of trapping.

With the housing according to at least one embodiment of the invention for accommodating electrical components, the conductor feed opening, which is arranged on the housing lower part, is delimited both by the housing lower part and by the housing cover in the closed state of the housing. In this case, the open state of the housing corresponds to the state when the conductors, in particular cables, are fitted. In this case, it is inconsequential whether a conductor is first fixed to an electrical component and then placed in the conductor feed opening, or vice versa. This provides an advantageous level of fitting and dismantling convenience.

According to at least one embodiment of the invention, the conductor feed opening and the opening of the housing lower part, which is covered by the housing cover, form a single opening. In the closed state, the housing cover covers the opening to be covered by it and at the same time delimits, together with the housing lower part, the conductor feed opening. Furthermore, at least one first guide element is integrally formed which is provided for engaging with at least one second guide element, which is integrally formed on the housing lower part. The housing cover therefore combines a plurality of functions. A first function resides in safely covering the housing lower part. A second function resides in at least partially delimiting the conductor feed opening, and a third function consists in providing an advantageous force effect for optimum sealing.

Advantageously, the housing according to at least one embodiment of the invention makes flexible fitting possible by virtue of the fact that connection of the conductor to an electrical component and positioning of the conductor(s) in the conductor feed opening can take place independently of one another. In particular the sequence of the two actions is not critical. Thus, the electrical component, for example a switching unit, can be connected to the conductor and, after the electrical connection, can be installed in the housing. The housing can therefore be replaced easily and/or preinstalled without an electrical connection between the conductors and the electrical component needing to be interrupted and produced again.

Advantageously, mechanical and electrical installation can thereby be temporally separated from one another, as a result of which the personnel required can possibly advantageously be split.

The low number of component parts of the housing according to at least one embodiment of the invention, which is essentially caused by the multiple functions of the housing cover, has likewise proved advantageous. No further component for fixing the conductor is required. Delimiting the conductor feed opening precisely in terms of shape by way of the housing cover makes it possible to provide a thread in the case of a conductor feed opening which is, for example, circular, although the adjoining housing cover represents a moveable component part. As a result, not only is the number of component parts reduced, but the design can also be implemented in a very simple manner.

In an advantageous embodiment, the resistance of the connection region to bending moment loads is improved by the interlocking engagement of at least one first guide element on the housing cover and at least one second guide element on the housing lower part. Owing to the proximity of the guide elements to the conductor feed opening, an axis of rotation for opening and closing the housing cover can be predetermined in such a way that a lever effect is exerted on the conductors arranged in the conductor feed opening. This lever effect results in clamping of the conductors in the conductor feed opening and therefore in the electrical connection of the electrical component(s) being relieved of strain in terms of conductor-side, in particular cable-side, damaging tensile forces.

In an advantageous embodiment, the first guide elements of the housing cover and/or the second guide elements of the housing lower part have one or more tensioning faces, which, by means of a wedge-like integral formation on the respective guide element, bring about an effect which narrows the conductor feed opening in the event of a rotational movement of the housing cover. In this case, the second guide elements of the housing lower part are moved slightly towards one another, and the housing lower part is elastically loaded. Owing to this further mechanism, the conductors can be clamped owing to the closing movement of the housing cover in addition by means of a small reduction in the size of the housing opening, whereby strain relief is brought about in the closed state of the housing. In addition, sealing of the conductor feed opening is assisted.

In an advantageous embodiment, the housing cover has a first integrally formed sealing element for completing a sealing-relevant shaping of the conductor feed opening. Owing to the integrally formed sealing element, the strength of the connection region, in particular the region around the conductor feed opening, is intensified. Advantageously, the integrally formed sealing element can be used for the shaping or delimiting of the conductor feed opening by the housing cover. Likewise, the force effect on the conductor(s) can be controlled by the integrally formed sealing element, in particular by its length.

Advantageously, the housing cover has a second sealing element for sealing the conductor feed opening, which sealing element is integrally connected to a seal of the opening which can be covered. The second sealing element and the seal of the cover are elastic sealing elements, the second sealing element being provided for sealing the conductor feed opening, and the seal being provided for elastically sealing the opening which can be covered. Owing to the integral formation of the second sealing element and the seal, not only is the number of component parts reduced but also both elements can be produced in one working step in the manufacturing process. The manufacturing process can be achieved, for example, by injecting a thermoplastic elastomer or another soft component.

Further advantageous embodiments and preferred developments of the invention can be gleaned from the description of the figures and/or the dependent claims.

BRIEF DESCRIPTION OF THE DRAWINGS

The invention will be described and explained in more detail below with reference to the example embodiments illustrated in the figures, in which.

DETAILED DESCRIPTION OF THE EXAMPLE EMBODIMENTS

Figure 1:
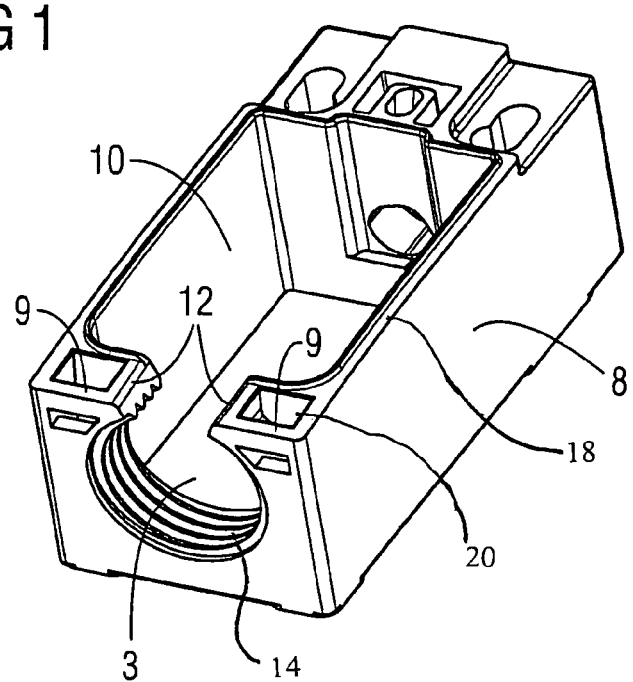
FIG. 1 shows a perspective view of an example embodiment of a housing lower part of a housing.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described. Like numbers refer to like elements throughout. As used herein, the terms "and/or" and "at least one of" include any and all combinations of one or more of the associated listed items.

FIG. 1 shows a housing lower part 8 having a cover opening 10 and a conductor feed opening 3 delimited by a portion 14 of the housing lower part 8 and a portion 16 of a housing cover 2. The connection of the two openings makes it possible to fit or insert cables into the interior of the housing lower part 8 in a simple manner.

In the vicinity of the conductor feed opening 3, two second guide elements 9 are integrally formed as openings 20 in a mating surface 18 of the housing lower part 8. The second guide elements 9 make it possible to stop and rotatably guide first guide elements 5 of the housing cover 2 (depicted in FIGS. 2, 3 and 5). Advantageously, the second guide elements 9 are combined with in each case one cutout, the movement of the first guide elements 5 within the housing lower part 8 being taken into consideration.

The size of the second guide elements 9 can be configured taking into consideration the width of the connection of the cover opening 10 and the conductor feed opening 3. The connection of the two openings may also be designed for a very specific cable or conductor thickness, with the result that a conductor can only just be inserted, but, owing to the presence of the connection, can be held in the conductor feed opening 3. The cable or conductor is therefore effectively prevented from sliding out in undesirable fashion.

Figure 2:
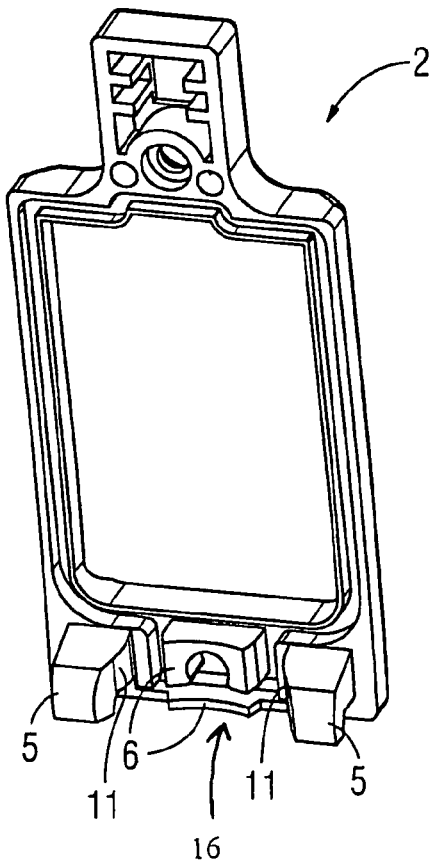
FIG. 2 shows a perspective view of an example embodiment of a housing cover for the housing lower part illustrated in FIG. 1.

FIG. 2 shows a housing cover 2 having two first guide elements 5 for assisting the partial rotational movement of the housing cover 2 when the first guide elements 5 are engaging in the associated second guide elements 9 of the housing lower part 8.

In addition, the housing cover 2 has two first sealing elements 6, which are provided for sealing the conductor feed opening 3. The arrangements of the two sealing elements 6 and also their shaping assists in anchoring a second sealing element 7 for sealing the conductor feed opening 3. The first integrally formed sealing elements 6 furthermore serve the purpose of transferring pressure to the inserted cables or conductors when the housing cover 2 is closed.

Figure 3:
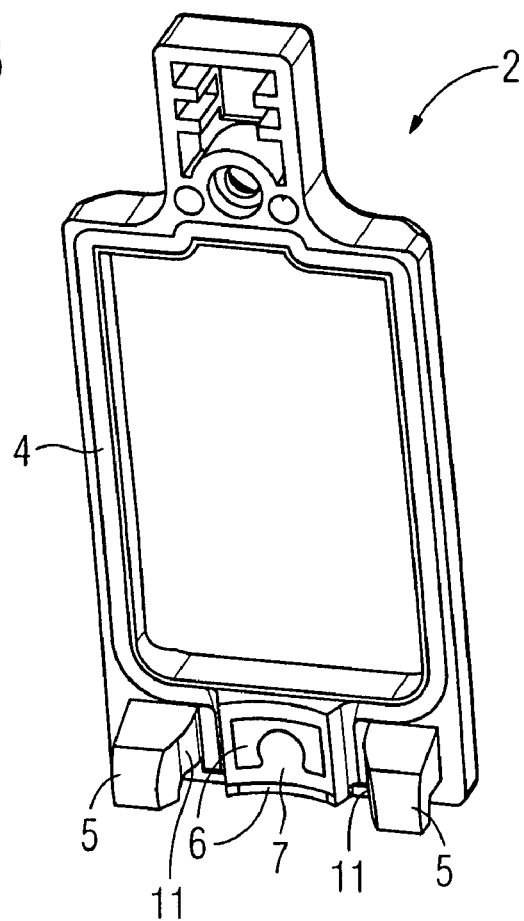
FIG. 3 shows a perspective view of the housing cover from FIG. 2 with a seal.

FIG. 3 shows a housing cover having a seal 4. For sealing purposes, a seal 4 of the cover opening 10 and a second sealing element 7 are used. Both sealing elements 4, 7 can be realized using a soft component (thermoplastic elastomer) in the case of a housing cover 2 which is produced from plastic. Such a material can be sprayed in in a simple manner and can also advantageously assist in the shaping of the second sealing element 7. Thus, the second sealing element 7 can be used for the optimum elastic sealing of the conductor feed opening 3. A surface of the second sealing element 7 which is flat, curved or provided with a thread is therefore possible, for example.

In a particularly simple embodiment, the first sealing elements 6 can be embedded in the second sealing element 7 in such a way that a seal of the conductor feed opening 3 is brought about merely by the second sealing element 7.

Figure 4:
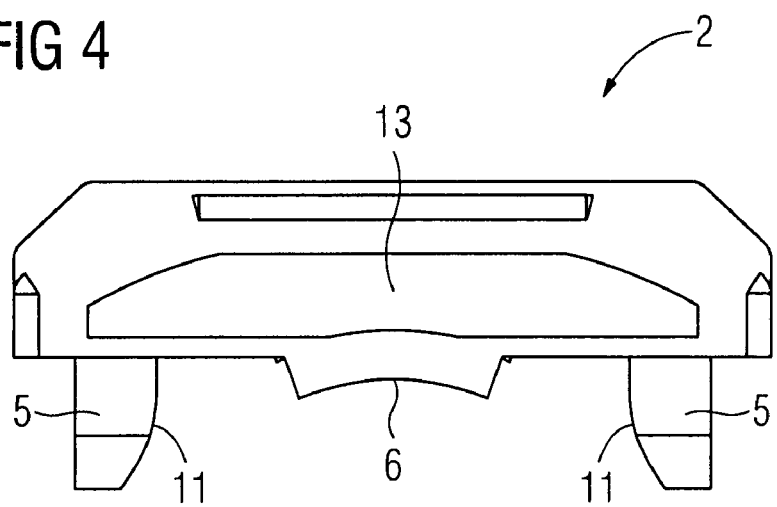
FIG. 4 shows a view of the housing cover from FIG. 2.

FIG. 4 shows a view of the housing cover 2 from FIG. 2, in which a cutout 13 is provided on the rear side of the housing cover 2. This rear side is the side of the housing cover which faces the conductors or the conductor connection apparatus and/or a sealing apparatus. In an elegant manner, the cutout prevents the housing cover 2 from becoming wedged, which housing cover also remains operable, i.e. rotatable, with the conductors installed.

Furthermore, tensioning faces 11 are provided which, during the closing operation, cause the second guide elements 9 and therefore the conductor leadthrough opening to be drawn together. This results in an effective strain relief of the conductors, in particular cables. In addition, owing to the interaction with the sealing edge 12, an effective sealing of the housing is achieved.

Figure 5:
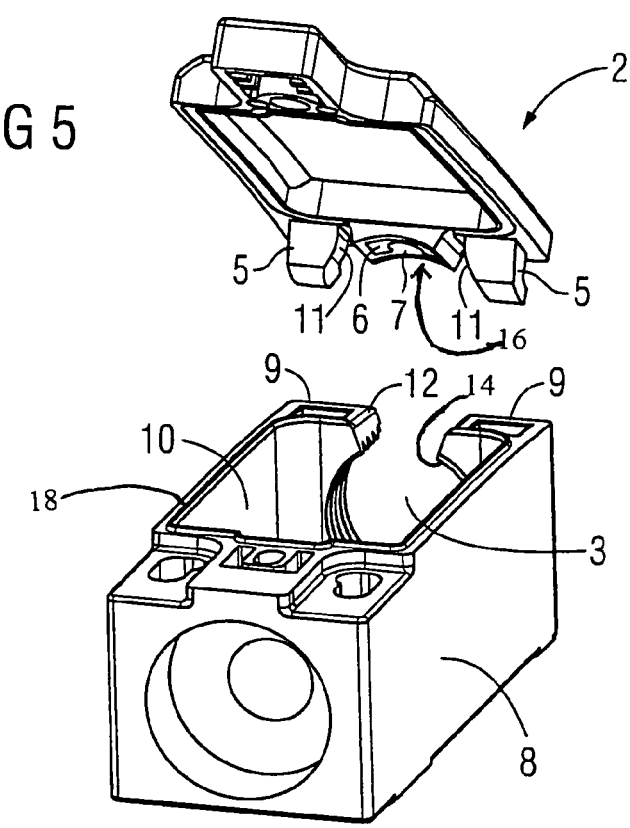
FIG. 5 shows a perspective view of the housing parts from FIGS. 1 to 4 in a first fitting step.

FIG. 5 shows a housing in a first fitting step. The housing essentially comprises the housing lower part 8 and the housing cover 2. Both component parts are each located in a position in relation to one another which corresponds to a first fitting step. In order to thread in the housing cover 2, a translation in the direction of the cover opening 10 and a subsequent rotational movement are required. After the rotational movement, the housing cover 2 covers the cover opening 10 of the housing lower part 8.

Advantageously, the housing cover 2 can be fixed with a screw to the housing lower part 8 in the closed state. The first guide elements 5 assist the fixing process in such a way that only one screw is sufficient to carry out the fixing.

In the covered state (cover opening 10 covered), the conductor feed opening 3 is complete in terms of its geometry. Advantageously, the conductor feed opening 3 has an internal thread, which is used as part of a standardized interface between the housing and the surrounding environment of the installation. In this case, no additional adaptor part is required. The standardized plug or conductor screw connection can be provided directly on the housing.

The tensioning faces 11, which move the second guide elements 9 towards one another in the event of a closing movement of the housing cover 2 and therefore bring about a constriction of the conductor leadthrough opening 3 and possibly clamping of the conductors located therein (not depicted) by means of elastic loading of the housing lower part 8, have proven to be advantageous. The degree of constriction can in this case be defined via a corresponding integral formation of the tensioning faces 11 or by way of a corresponding tensioning angle.

Figure 6:
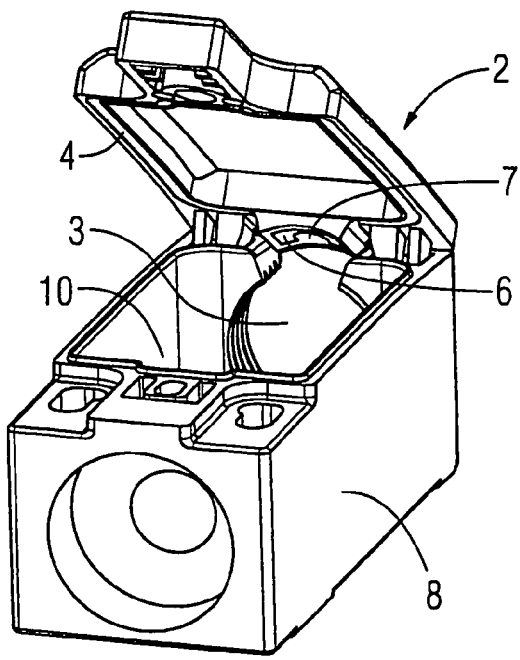
FIG. 6 shows a perspective view of the housing parts from FIGS. 1 to 4 in a second fitting step.

FIG. 6 shows the housing in a second fitting step. The first and second guide elements 5, 9 engage one inside the other in the second fitting step and allow for a partial rotational movement with an axis of rotation which is arranged close to the conductor feed opening 3. After the partial rotational movement of the housing cover 2, the housing is in the closed state. This view again shows that no additional sealing part, but merely, for example, a cable screw-connection sealing ring is required for sealing purposes. The second sealing part 7, which is in the form of a two-dimensional soft component, in addition to the already mentioned simplification, also makes possible a pressure surface on the cable screw-connection sealing ring or on the conductor(s). The strength of the connection region is achieved by the desired lever effect by means of the housing cover 2 or its rotational movement in the direction of the housing lower part 8, and therefore an effective strain relief of the mechanical connection of the conductors with electrical components (not shown) within the housing lower part 8 is realized.

The region covered by the first and second sealing elements 6, 7 defines, in relation to the mid-point of the conductor feed opening 3, an opening angle of the conductor feed opening 3. This opening angle may be up to 180°. However, opening angles of less than 180° are advantageous. This ensures, that in the open state, an inserted cable can be held within the conductor feed opening 3. In addition, the sealing complexity with smaller opening angles is less. However, any angle between 0° and 180° is conceivable, for example 10°, 30°, 50° or 70°.

By way of summary, at least one embodiment of the invention relates to a housing for accommodating electrical components having a housing lower part, having a conductor feed opening and having a housing cover for covering the housing lower part. As well as an advantageous reduction in components, the housing is intended to provide the possibility of very convenient fitting and dismantling. The conductor feed opening is provided for the purpose of being delimited by the housing lower part and the housing cover in the closed state of the housing. This obviates the need for the careful threading-in operation when installing a cable on an electrical component in the interior of the housing. In addition, the housing cover delimiting the conductor feed opening is provided with first guide elements, which are provided for engaging in the housing lower part.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A housing for accommodating electrical components, comprising:
    a housing lower part, including a conductor feed opening;
    a housing cover to cover the housing lower part, the conductor feed opening being delimited by a portion of the housing lower part and a portion of the housing cover in a closed state of the housing;
    at least one first guide element, integrally formed on the housing cover, and at least one second guide element, arranged in the housing lower part, the at least one first guide element being useable to assist a partial rotational movement of the housing cover when engaged with the at least one second guide element, wherein the housing cover includes at least one first sealing element to complete shaping of the conductor feed opening.

2. The housing as claimed in claim 1, wherein at least one conductor is insertable in the housing lower part, through the conductor feed opening, the conductor feed opening not being delimited in a region of the housing cover in an open state.

3. The housing as claimed in claim 1, wherein the first sealing element at least partially seals the conductor feed opening, the first sealing element being integrally connected to a seal of the housing cover.

4. The housing as claimed in claim 1, wherein an axis of rotation for opening and closing the housing cover is determined by the at least one first guide element.

5. The housing as claimed in claim 4, wherein the at least one sealing element, to complete shaping of the conductor feed opening, is arranged within the axis of rotation.

6. The housing as claimed in claim 1, wherein the conductor feed opening includes an internal thread.

7. The housing as claimed in claim 1, wherein the housing cover includes a second sealing element to at least partially seal the conductor feed opening, the second sealing element being integrally connected to a seal of the housing cover.

8. A housing cover for covering a housing lower part of a housing for accommodating electrical components, the housing lower part including a conductor feed opening, the housing cover delimiting the conductor feed opening in a closed state of the housing, the housing cover comprising:
    at least one first guide element, integrally formed on the housing cover and being provided to engage with at least one second guide element arranged in the housing lower part, to assist a partial rotational movement of the housing cover: and
    a first sealing element to complete shaping of the conductor feed opening.

9. The housing cover as claimed in claim 8, further comprising at least one second sealing element to at least partially seal the conductor feed opening. the at least one second sealing element being integrally connected to a seal of the cover opening.

10. The housing cover as claimed in claim 8, wherein an axis of rotation for opening and closing the housing cover is provided by the at least one first guide element.

11. The housing cover as claimed in claim 10, wherein the first sealing element, is arranged in the vicinity of the axis of rotation.

12. The housing cover as claimed in claim 8, further comprising means for strain relief.

13. The housing cover as claimed in claim 8, comprising at least one sealing element to at least partially seal the conductor feed opening, the at least one sealing element being integrally connected to a seal of the cover opening.

14. A housing lower part of a housing for accommodating electrical components, the housing lower part being coverable by a housing cover and comprising:
    a conductor feed opening, delimited by a portion of the housing lower part and a portion of the housing cover in a closed state of the housing; and
    at least one housing lower part guide element, provided to guide at least one housing cover guide element in the housing lower part, wherein
    the housing lower part includes a mating surface that receives the housing cover and the at least one housing lower part guide element is formed as an opening in the mating surface.

15. The housing lower part as claimed in claim 14, wherein at least one conductor is insertable in the housing lower part, through the conductor feed opening, the conductor feed opening not being delimited in a region of the housing cover in an open state.

16. The housing lower part as claimed in claim 14, wherein the conductor feed opening includes an internal thread.

* * * * *